United States Patent
Isacsson (10) Patent No.: US 11,962,059 B2
(45) Date of Patent: Apr. 16, 2024

(54) METHOD OF OPERATING AN N-WAY POWER COMBINER NETWORK AND AN N-WAY POWER COMBINER NETWORK

(71) Applicant: SAAB AB, Linkoeping (SE)

(72) Inventor: Magnus Isacsson, Goeteborg (SE)

(73) Assignee: SAAB AB, Linkoeping (SE)

( * ) Notice: Subject to any disclaimer, the term of this patent is extended or adjusted under 35 U.S.C. 154(b) by 550 days.

(21) Appl. No.: 17/250,560

(22) PCT Filed: Aug. 29, 2018

(86) PCT No.: PCT/SE2018/050865
§ 371 (c)(1),
(2) Date: Feb. 3, 2021

(87) PCT Pub. No.: WO2020/046182
PCT Pub. Date: Mar. 5, 2020

(65) Prior Publication Data
US 2021/0296752 A1    Sep. 23, 2021

(51) Int. Cl.
*H03F 1/02*    (2006.01)
*H01P 5/12*    (2006.01)
(Continued)

(52) U.S. Cl.
CPC ............. *H01P 5/12* (2013.01); *H03F 1/0277* (2013.01); *H03F 3/245* (2013.01); *H03F 3/602* (2013.01); *H03F 3/72* (2013.01); *H03H 11/16* (2013.01)

(58) Field of Classification Search
CPC ....................................................... H03F 1/02
(Continued)

(56) References Cited

U.S. PATENT DOCUMENTS

| 4,315,222 A | 2/1982 | Saleh |
| 4,439,740 A | 3/1984 | Harrington |

(Continued)

FOREIGN PATENT DOCUMENTS

| EP | 1187314 A1 | 3/2002 |
| KR | 1020160146649 A | 12/2016 |

(Continued)

OTHER PUBLICATIONS

European Patent Office, Extended European Search Report received for Application No. 18932129.2, mailed Mar. 7, 2022, 9 pages, Germany.

(Continued)

*Primary Examiner* — Henry Choe
(74) *Attorney, Agent, or Firm* — ALSTON & BIRD LLP (57) ABSTRACT

Method of operating a power combiner network (1), the power combiner network (1) comprising a power combiner device (10) having N secondary ports (11(1, 2, N)) combining into one primary port (12), wherein respective N secondary port (11(1, 2, . . . , N)) is provided with a phase shifter arrangement (13) and a load control arrangement (14). Respective phase shifter arrangement (13) is configured to set a phase of a signal fed through respective N secondary port (11(1, 2, . . . , N)). Respective load control arrangement (14) is configured to set the N secondary ports (11(1, 2, . . . , N)) in an active or in an inactive operation mode. For I inactive secondary ports (11(1)) the load control arrangement (14) is further configured to set a phase of the signal reflected from the I inactive secondary ports (11(1)). The method comprises the method steps of; step A (100), selecting which of the N secondary ports (11(1, 2, . . . , N)) that should be set in an inactive operation mode and which of the N secondary ports (11(1, 2, . . . , N)) that should be set in an active operation mode, step B (110), setting selected I (Continued)

inactive secondary ports (11(1)) in an inactive operation mode by means of the load control arrangement (14), step C (120), retrieving a phase required for respective I inactive secondary port (11(1)) and retrieving a phase required for respective A active secondary port (11(2)) in order for respective A active secondary port (11(2)) to minimize the reflected signal from the power combiner device (10) and provide desired power to the primary port (12), step D (130), setting respective load control arrangement (14) for respective I inactive secondary port (11(1)) according to respective retrieved phase, and step E (140), setting respective phase shifter arrangement (13) for respective A active secondary port (11(2)) according to respective retrieved phase.

14 Claims, 3 Drawing Sheets

(51) Int. Cl.
  *H03F 3/24* (2006.01)
  *H03F 3/60* (2006.01)
  *H03F 3/72* (2006.01)
  *H03H 11/16* (2006.01)

(58) Field of Classification Search
  USPC .............................................. 330/124 R, 295
  See application file for complete search history.

(56) References Cited

U.S. PATENT DOCUMENTS

| | | | |
|---|---|---|---|
| 5,136,300 A | 8/1992 | Clarke et al. | |
| 5,872,491 A | 2/1999 | Kim et al. | |
| 6,518,856 B1 * | 2/2003 | Casale | H01P 5/12 333/32 |
| 8,952,752 B1 | 2/2015 | Huettner | |
| 9,136,578 B2 * | 9/2015 | Nguyen | H01P 1/00 |
| 9,768,745 B2 | 9/2017 | Ivanov et al. | |
| 10,116,276 B2 * | 10/2018 | Lin | H03F 3/604 |
| 10,630,250 B2 * | 4/2020 | Lin | H03F 1/0205 |
| 11,044,004 B2 * | 6/2021 | Hormis | H04B 7/0408 |
| 11,362,698 B2 * | 6/2022 | Holzer | H04B 1/44 |

FOREIGN PATENT DOCUMENTS

| | | |
|---|---|---|
| WO | WO 98/29941 A1 | 7/1999 |
| WO | WO 01/63756 A1 | 8/2001 |
| WO | WO 2015/099560 A1 | 7/2015 |
| WO | WO 2015/112047 A1 | 7/2015 |

OTHER PUBLICATIONS

International Searching Authority, International Search Report and Written Opinion for International Application No. PCT/SE2018/050865, May 8, 2019, 14 pages, Swedish Patent and Registration Office, Sweden.

International Preliminary Examining Authority, International Preliminary Report on Patentability, Chapter II, received for International Application No. PCT/SE2018/050865, Jun. 30, 2020, 6 pages, Swedish Patent and Registration Office, Sweden.

Picard, N., et al., "Analysis of failure impact on microwave power combining", Proceedings of the 39th European Microwave Conference, Sep. 29 to Oct. 1, 2009, pp. 898-901, Italy.

Korean Intellectual Property Office, Notice of Preliminary Rejection received for KR Application No. 10-2021-7009017, dated May 13, 2023, 10 pages, English language summary included.

* cited by examiner

METHOD OF OPERATING AN N-WAY POWER COMBINER NETWORK AND AN N-WAY POWER COMBINER NETWORK

CROSS REFERENCE TO RELATED APPLICATIONS

This application is a National Stage Application, filed under 35 U.S.C. § 371, of International Application No. PCT/SE2018/050865, filed Aug. 29, 2018; the contents of which are hereby incorporated by reference in its entirety.

BACKGROUND

Related Field

The invention relates to a method for operating an N-way power combiner network. The invention may be applied in centrally fed antenna systems or distribution networks. The invention is however not restricted to these particular uses but is also applicable for example in amplifier networks such as a network comprising a plurality of Solid State Power Amplifiers.

DESCRIPTION OF RELATED ART

Today Traveling Wave Tube amplifiers, generally referred to as TWT amplifiers, are often replaced with Solid State Power Amplifiers, generally referred to as SSPA, as SSPA usually are more cost effective and have higher reliability. However, the power capacity of SSPAs is generally too low for the output requirements of radar and communication systems and in order to reach the required output power a number of SSPAs need to be combined by means of a power combiner. If one amplifier device of such power combiner network fails the output power of the power combiner decreases unproportionally due to mismatch losses.

Each transmission line has a characteristic impedance. The characteristic impedance is amongst others determined by the geometry and of the materials of the transmission line. The mismatch losses is due to that the characteristic impedance of the transmission line differs from the load impedance. If a transmission line is terminated with the same impedance as the characteristic impedance of the transmission line there will be no signal reflection, hence no losses due to mismatch.

The load impedance of a transmission line of a power combiner network input port, herein generally referred to as secondary port, of a power combiner network is generally adapted to the characteristic impedance of the circuit. However, when an amplifier device of a secondary port fails that transmission line will be terminated improperly whereby input impedance of the secondary port with the failed amplifier device, and the input impedances of the secondary ports of the still operational amplifier devices, are changed. This leads to mismatch. Mismatch losses of a transmission line is defined as the amount of output power that is lost due to the impedance mismatch.

Output power loss by failure of at least one amplifier device of a power combiner network, where the reflected signal from the combiner network is absorbed into a load such that the impedance seen by the amplifiers are unchanged, may be expressed by equation (1) below;

$$\frac{P_{out}}{P_{max}} \approx \left(\frac{A}{M}\right)^2 \quad (1)$$

where
$P_{out}$=actual output power,
$P_{max}$=maximum output power,
A=ports with working amplifier devices, and
M=total number of power combiner network ports.

U.S. Pat. No. 4,315,222 refers to an N-way non-hybrid power combiner arrangement for microwave amplifiers. In operation, sensing means are coupled in a one-to-one relationship with the individual amplifiers to monitor amplifier performance and sense amplifier failure. In one embodiment of the present invention, shorting devices are disposed adjacent to the outputs of the individual amplifiers and coupled to the associated sensing means in a one-to-one relationship. In an alternative embodiment, open-circuiting devices are disposed at a predetermined distance from the amplifier outputs along the transmission lines and coupled to their respective sensing means. Upon identifying amplifier failure, the sensing means coupled to that particular amplifier activates either its associated short-circuiting or open-circuiting device, which in turn uncouples the failed amplifier and the transmission line associated therewith. However, uncoupling failed amplifiers as disclosed in either way disclosed in U.S. Pat. No. 4,315,222 does not address mismatch.

BRIEF SUMMARY

A general object of the invention is to provide a method of operating an N-way power combiner network which at least partially overcomes or alleviates problems of prior art. A particular object of the invention is to provide a method of operating an N-way power combiner network which reduces the unproportional output power loss at failure of power amplifiers devices of the N-way power combiner network, i.e. what generally is referred to as graceful degradation.

Yet an object of the invention is to provide an N-way power combiner network capable of executing methods of the invention.

N-way power combiner networks, comprising a number of secondary ports, i.e. input ports, combining into one primary port, i.e. output port, generally comprises a number of power amplifier devices. If one amplifier device of such an N-way power combiner network fails the output power of the N-way power combiner network decreases unproportionally due to mismatch losses.

Ideally, the decrease in output power at failure of at least one amplifier device is expressed by equation (2) below;

$$\frac{P_{out}}{P_{max}} = \left(\frac{A}{M}\right) \quad (2)$$

However, the actual decrease in output power at failure of at least one amplifier device, where the reflected signal from the combiner network is absorbed into a load such that the impedance seen by the amplifiers are unchanged, can usually be expressed by equation (1) below;

$$\frac{P_{out}}{P_{max}} \approx \left(\frac{A}{M}\right)^2 \quad (1)$$

Since the coupling between respective secondary port generally is different, failure of one secondary port affects the remaining still operational ports to different extent depending on how respective still operational secondary port is arranged in relation to the failed secondary port.

For many applications, it is advantageous to be able to deliberately switch off or select which secondary ports of an N-way power combiner network that should be active and which secondary ports that should be inactive. For example, shifting between secondary ports may prolong running or operational time of devices, such as for example an amplifier device, coupled to that specific secondary port. Thus, by alternating which secondary ports that are inactive the lifetime of individual devices, the N-way power combiner device or a larger device in which the N-way power combiner network is a part, may be prolonged. Shifting off secondary ports of an N-way power combiner can also be used to control output power of the N-way power combiner network.

A first aspect of the invention refers to a method of operating a Radio Frequency (RF)N-way power combiner network, the N-way power combiner network comprises a power combiner device having N secondary ports combining into one primary port. Respective N secondary port is provided with a phase shifter arrangement, wherein respective phase shifter arrangement is configured to set a phase, herein generally referred to as transmission phase, of a signal fed through respective N secondary port. Respective N secondary port is further provided with a load control arrangement, wherein respective load control arrangement is configured to set the N secondary ports in an active or in an inactive operation mode. The load control arrangement is further configured to, for the I inactive secondary ports which are set in inactive operation mode, set a phase, herein generally referred to as termination load phase, of the signal reflected from the I inactive secondary ports and seen by the power combiner device. The method further comprises the method steps of;

selecting which of the N secondary ports that should be set in an inactive operation mode, thereby being I inactive secondary ports, and which of the N secondary ports that should be set in an active operation mode, thereby being A active secondary ports, wherein A=N−I, setting selected I inactive secondary ports in an inactive operation mode by means of the load control arrangement, retrieving a phase value required for respective I inactive secondary port and retrieving a phase value required for respective A active secondary port in order for respective A active secondary port to minimize the reflected signal from the power combiner device and provide desired power to the primary port, given current conditions, setting respective load control arrangement for respective I inactive secondary port according to respective retrieved phase value, i.e. termination load phase, and setting respective phase shifter arrangement for respective A active secondary port according to respective retrieved phase value, i.e. transmission phase.

An exemplary advantage with the method is that the method enables which secondary ports that should be set as active secondary ports and which secondary ports that should be set as inactive secondary ports can be selected freely without significantly affecting the contribution from the active secondary ports. In other words, when the inactive secondary ports are terminated in non-resistive loads and the transmission phase of the active ports are set, the input impedance of the primary port and the active secondary ports of the N-way power combiner network should not change.

It is advantageous if the power combiner network is of a low loss design without power absorbing or resistive port impedance balancing devices.

The method is executed by means of a control unit initiating and controlling the hardware involved when performing respective step of the method. The N-way power combiner network may for example be a radial N-way power combiner network comprising a radial N-way power combiner device.

The methods, exemplary embodiments and realizations of the invention are applicable for N-way power combiner networks comprising for example 8, 12 or 24, i.e. N=8, 12 or 24, secondary ports.

Phase shifter arrangement is herein defined as an arrangement configured to set a phase of a signal fed through active secondary ports. The phase shifter arrangement comprises a phase shifting device, which herein is defined as a microwave network capable of controlling the phase of an RF signal. The phase shifting device and/or the phase shifting arrangement can be realized in any one of the numerous ways in which phase shifting of a microwave signal can be obtained. The phase shifting device and/or phase shifter arrangement may be capable of controlling the phase of a microwave signal steplessly between 0 and 360 degrees, such as for example by using a GaAs MM IC or a vector modulator circuit, to, in the most basic realizations, just be able to control the phase between two discrete phase values, for example by means of using diodes. Except for being capable of controlling the phase of a microwave signal the phase shifter arrangement may be able to operate as a switch, having an open and a closed operation mode.

Load control arrangement is herein defined as an arrangement capable of setting respective secondary port in an active or inactive mode and/or set a termination load phase of a signal of respective inactive secondary port. Setting respective secondary port in an active or inactive mode is enabled by that the load control arrangement is provided with a shifting functionality and setting the termination load phase is enabled by that the load control arrangement is provided with a phase shifting functionality, preferably provided by a phase shifting device. As will be disclosed more in detail below, in some embodiments of the invention the load control arrangement may share components with the phase shifter arrangement.

The method step of selecting which of the N secondary ports that should be set in an inactive operation mode, thereby being I inactive secondary ports, and which of the N secondary ports that should be set in an active operation mode, thereby being A active secondary ports, wherein A=N−I, may be dependent on and/or based on a number of possible parameters, circumstances or events, of which a few examples will be discussed below.

According to an embodiment of the invention, the step of selecting which of the N secondary ports that should be set in an inactive operation mode, thereby being I inactive secondary ports, and which of the N secondary ports that should be set in an active operation mode, thereby being A active secondary ports, comprises the sub method step of determining which of the N secondary ports that needs to be combined in order to reach a desired N-way power combiner network output power.

By only selecting secondary ports which for example are required for reaching a desired N-way power combiner network output power it is possible to operate the N-way power combiner network in a low energy consumption mode and thereby possibly in a more efficient way. Thus, the method step of selecting A active ports provides the advantage that it enables power output regulation of the N-way power combiner network. Independently of how many secondary active ports that are selected to be active, by applying the method of the invention, desired output power, given the current configuration of active and inactive secondary ports, is obtained.

According to another embodiment of the invention, the power combiner device comprises an amplifier device. The method step of selecting which of the N secondary ports that should be set in an inactive operation mode, thereby being I inactive secondary ports, and which of the N secondary ports that should be set in an active operation mode, thereby being A active secondary ports, may then comprise the sub method step of detecting failure of operation of the amplifier device. According to the embodiment, each of the N secondary port for which a failed amplifier device has been detected is selected to be an I inactive secondary port, thus is set in inactive operation mode.

As previously discussed, failure of one amplifier device of an N-way power combiner network having a plurality of secondary input ports provided with amplifier devices generally results in an unproportional power output decrease due to mismatch losses. However, the invention enables disconnection of a secondary port if the amplifier device of that secondary port fails without the unproportional power output loss. By means of methods according to the invention, the load impedances experienced by the still working amplifier devices are constant.

Amplifier device is herein defined as an electronic device capable of increasing the power of a signal by using electric power from an external power supply, whereby the amplitude of a signal is increased.

The method step of retrieving the phase values required for respective inactive secondary port and respective active secondary port, in order for respective active secondary port to experience minimum reflected signal from the power combiner device and provide desired power to the primary port, can be performed in a number of possible ways. According to one exemplary embodiment of the invention, termination load phases and transmission phases may be retrieved from a reference database. The reference database may for example be cloud based, whereby it may be continuously updated, and may for example have been created by means of in advance performed calculations and/or measurements.

Calculations of transmission phases and termination load phases may be performed according to a number of ways. It is for example possible to set up a model of the current N-way power combiner network realization and in advance, or in real-time, calculate respective phase values for active/inactive configurations. It is also possible to use predefined calculation models of commonly used N-way power combiner networks together with an algorithm developed to adapt calculated phases from the predefined calculation model to other realizations of N-way power combiners.

Thus, according to one embodiment of the invention, the method step of retrieving the phase values required for respective I inactive secondary port and retrieving the phase values required for respective A active secondary port, in order for respective A active secondary port to minimize the reflected signal from the power combiner device and provide desired power to the primary port, comprises the sub method steps of; accessing a reference database and retrieving respective required phase from the reference database.

For example for small and/or commonly used N-way power combiner networks using reference databases for retrieving termination load phases and transmission phases may be advantageous since this can be done without that possibly time consuming, real time calculation operations have to be performed.

The real time or in advance performed calculations of transmission phases and load termination phases may for example be performed by using scattering parameters. Scattering parameters describe the electrical behaviour of linear electrical networks. Scattering parameters use complex numbers to describe the steady state transmission and reflection to/in each port of an electrical network. Thus, according to exemplary embodiments of methods of the invention the method step of retrieving termination load phases and transmission phases can be based on calculated scattering parameters of the N-way power combiner network.

Thus, according to one embodiment of the invention, the method steps of retrieving the phase value required for respective I inactive secondary port and retrieving the phase value required for respective A active secondary port, in order for respective A active secondary port to minimize the reflected signal from the power combiner device and provide desired power to the primary port, comprises the sub method steps of; calculating respective required phase value.

It is also possible to combine retrieving required transmission phase, for active secondary ports, and termination load phase, for inactive secondary ports, by accessing a reference database and by means of retrieved data calculate required transmission phase and load termination phase.

According to another embodiment of the invention, the sub method step of calculating respective required phase value comprises the sub method step of setting up an equation system, and subsequently solving the equation system that is set up.

According to another aspect of the invention discussed, the invention refers to an N-way power combiner network comprising a power combiner device having N secondary ports combining into one primary port. Respective N secondary port is provided with a phase shifter arrangement, wherein respective phase shifter arrangement is configured to set a phase of a signal fed through respective N secondary port. Respective N secondary port is further provided with a load control arrangement. The load control arrangement is configured to set the N secondary ports in an active or in an inactive operation mode. For I inactive secondary ports set in inactive operation mode the load control arrangement is configured to set a phase of the signal reflected from the I inactive secondary ports and seen by the power combiner device. The N-way power combiner network is thereby configured to execute any aspect of methods according to the invention.

An exemplary advantage with an N-way power combiner network according to the invention is that there will be no unproportional output power loss due to impedance mismatch when, of some reason, determining that not all secondary ports of the N-way power combiner network should be operational. The selection may for example be based on that an amplifier device of a secondary port has failed or that it is desirable to operate the N-way power combiner device in a low energy consumption mode in which not all secondary ports are operational. Given the active secondary ports selected, the conversion efficiency and output power, defined in relation to a particular load, can be kept constant by utilizing the invention. The input impedance of the A active secondary ports and the primary port of the power combiner device will be essentially constant irrespectively of number of active and inactive secondary ports.

According to yet an embodiment of the invention, respective secondary port is provided with an amplifier device.

Amplifier devices are generally optimized for output power and efficiency at a certain load. An exemplary advantage with an N-way power combiner network according to the invention for which respective secondary port is provided with an amplifier device is that if one amplifier device fails the load experienced by the remaining, still working amplifier devices remains essentially the same.

Thereby the operational conditions of the still working amplifier devices is not affected and they will not be operated at a less preferable operational state, which otherwise may affect output power, efficiency and lifetime. As previously discussed, this also has the effect that the generally unproportional output power loss at failure of an amplifier device due to mismatch can be mitigated.

According to another embodiment of the invention, respective amplifier device is arranged between the power combiner device and the phase shifter arrangement for respective N secondary port. Phase shifter arrangements, comprising phase shifting devices, are generally lossy components for example due to the many passive devices used when designing phase shifter arrangements. Arranging the amplifier device after the phase shifter arrangement, in relation to the power combiner input direction, has the advantage that the amplified signal, provided by the amplifier device, is fed to the N-way power combiner device without the losses that feeding the signal through the phase shifter arrangement otherwise would imply.

According to one embodiment of the invention, the load control arrangement comprises a switch and a phase shifting device. By means of the switch it is possible to terminate respective secondary port, i.e. open up the circuit of that secondary port, and the phase shifting device provides the functionality of shifting phase of the reflected signal such that the secondary port may be terminated in a non-resistive load. According to yet one embodiment of the invention, respective phase shifter arrangement is arranged between the power combiner device and the amplifier device for respective N secondary port. Arranging the phase shifter arrangement between the amplifier device and the power combiner device of the N-way power combiner network has the advantage that the phase shifter arrangement may be used also for the load control arrangement, and that only one phase shifter arrangement is required irrespectively of if the secondary port of that transmission line is set in active operation mode or inactive operation mode. Thus, according to another embodiment of the invention, the phase shifter arrangement and the phase shifting device of the load control arrangement is the same component.

According to aspects of the invention, the amplifier devices may be Solid State Power Amplifiers, SSPAs. SSPA may be preferred over TWT amplifiers, since SSPA usually are more cost effective and have higher reliability.

As is apparent in the light of the invention as described herein the N-way power combiner network may also be used as an N-way power splitter network.

According to yet other aspects of the invention, the invention relates to a computer program comprising computer program code for performing the steps of any exemplary method disclosed herein when said computer program is executed by a computer device. Yet aspects of the invention relates to a computer readable medium carrying a computer program comprising computer program code for performing the steps of any method disclosed herein when said computer program is executed by a computer device. Further aspects of the present invention relates to a control unit for controlling the operation of a power combiner network wherein the control unit is configured to perform the steps of any method disclosed herein.

As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, sub steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one skilled in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

BRIEF DESCRIPTION OF THE FIGURES

With reference to the appended drawings, below follows a more detailed description of exemplary embodiments of the invention.

DETAILED DESCRIPTION

The following description of exemplary embodiments of the present invention is presented only for purposes of illustration and should not be seen as limiting. The description is not intended to be exhaustive and modifications and variations are possible in the light of the above teachings, or may be acquired from practice of various alternative embodiments of the invention. The examples discussed herein were chosen and described in order to explain the principles and the nature of various example embodiments and its practical application to enable one skilled in the art to utilize the exemplary embodiments in various manners, and with various modifications, as are suited to the particular use contemplated. It should be appreciated that the aspects presented herein separately may be practiced in any combination with each other unless otherwise explicitly is stated.

Herein, reoccurring reference signs refer to corresponding elements throughout the detailed description. When herein using reference signs indexed with a letter what is referred to is an exemplary embodiment of a feature that may be realized in different ways.

In the figures, for the sake of simplicity, radial N-way power combiner networks with eight secondary ports combining into one primary ports is shown. However, the methods, exemplary embodiments and realizations disclosed herein are just as applicable for other possible configurations. The methods, exemplary embodiments and realizations of the invention is for example just as applicable for N-way power combiner networks comprising for example 8, 12 or 24 secondary ports.

FIGS. 1a, 1b, 1c and 1d disclose four different embodiments disclosing how an N-way power combiner network 1a, 1b, 1c, 1d according to the invention may be realized. However, the invention is not to be seen as limited to these particular embodiments. Other realizations fulfilling the requirements of an N-way power combiner network according to the invention is also possible. For the sake of simplicity, in FIGS. 1a, 1b, 1c and 1d circuit arrangements 2a, 2b, 2c, 2d of only two secondary ports 11(1), 11(2) of the eight secondary ports 11(1, 2, . . . , N) are disclosed in detail. However, according to the invention all secondary ports 11(N) are provided with a circuit arrangement 2a, 2b, 2c, 2d according to the invention.

Figure 1A:
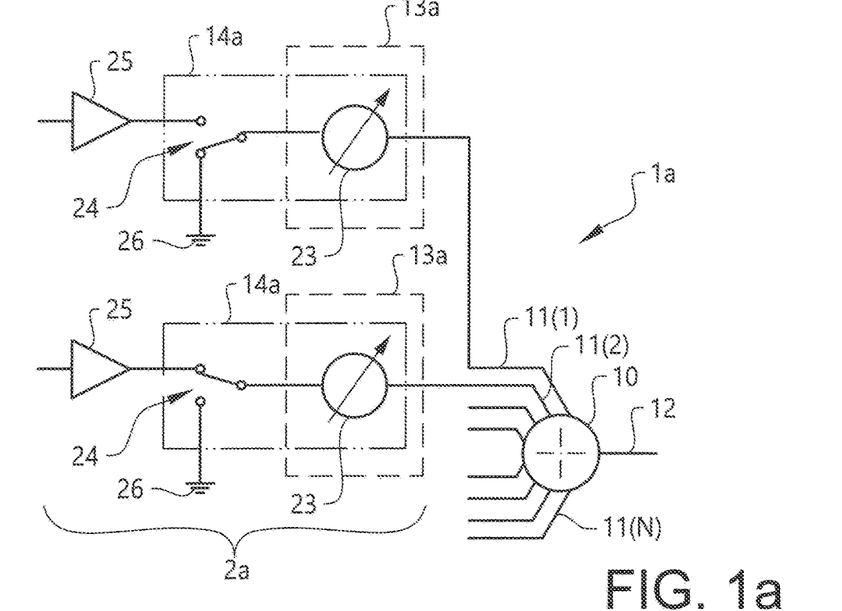
FIG. 1a discloses a first exemplary embodiment of an N-way power combiner network according to the invention, FIG. 1b discloses a second exemplary embodiment of an N-way power combiner network according to the invention, FIG. 1c discloses a third exemplary embodiment of an N-way power combiner network according to the invention, FIG. 1d discloses a fourth exemplary embodiment of an N-way power combiner network according to the invention, FIG. 2 discloses a flow chart of an exemplary embodiment of a method of operating a power combiner network according to the invention, and FIG. 3 discloses another flow chart of exemplary embodiments of methods of operating a power combiner networks according to the invention.

FIG. 1a discloses a first exemplary embodiment of an N-way power combiner network 1a according to the invention. The power combiner network 1a comprises a power combiner device 10 having N secondary ports 11(1, 2, . . . , N) combining into one primary port 12. The circuit arrangements 2a of the secondary ports 11(1, 2, . . . , N) are provided with a phase shifter arrangement 13a, configured to set a phase of a signal fed through respective active secondary port 11(2, . . . , N). The circuit arrangements of the secondary port 11(1, 2, . . . , N) are further provided with a load control arrangement 14a, configured to set respective secondary port 11(1, 2, . . . , N) in an active or inactive operation mode and set a termination load phase of signal reflected from respective inactive secondary port 11(1).

The phase shifter arrangement 13a comprises a phase shifting device 23. The phase shifter arrangement 13a and the phase shifting device 23 can be realized in various ways using mechanical, electrical or electromechanical ways to control the phase and how the phase is affected of which a few is discussed herein. The phase shifter arrangement 13a is arranged next to the power combiner device 10 whereby the phase of a signal fed to the power combiner device 10 through the phase shifting device 23 may be controlled. Respective circuit arrangements 2a of the power combiner network 1a of FIG. 1a further comprises an amplifier device 25.

The load control arrangement 14a comprises a switch 24 capable of shifting between a closed position, in which the circuit of respective secondary port 11(1, 2, . . . , N) is closed, and an open position in which the circuit is open, i.e. is terminated. The switch 24 may be coupled to ground when being in the open position.

By means of the switch 24 of the load control arrangement 14a respective secondary port 11(1, 2, . . . , N) may be set in an active or in an inactive operation mode. In the exemplary embodiment of the invention disclosed in FIG. 1a a first secondary port 11(1) is set in inactive operation mode, indicated by that the switch 24 is set in an open position, and a second secondary port 11(2) is set in active operation mode, indicated by that the switch is set in a closed position. For an inactive secondary port 11(1) the load control arrangement 14a is configured to set a termination load phase of a signal reflected from the inactive secondary port 11(1) towards the power combiner device 10.

According to the exemplary embodiment of a power combiner network 1a of the invention respective phase shifter arrangement 13a is arranged between the power combiner device 10 and the amplifier device 25 for respective secondary port 11(1, 2, . . . N). The load control arrangement 14a comprises a switch 24 and a phase shifting device 23. In the exemplary embodiment of FIG. 1a the phase shifter arrangement 13a and the phase shifting device 23 of the load control arrangement 14a is the same component.

According to the invention, by means of the phase shifter arrangement 13a and the load control arrangement 14a the transmission phase of the active secondary ports 11(2) and the termination load phase of the inactive secondary ports 11(1) may be selected such that the inactive secondary port 11(1) is terminated in a non-resistive load, whereby the reflected signal from the inactive secondary ports 11(1), and the reflected signal from the active secondary ports 11(2) are added to the signal out from the primary port 12. Thereby desired power can be provided to the primary port 12 by the active secondary ports 11(2).

An exemplary advantage with a power combiner network according to the invention is that it provides the possibility to select which secondary ports that should be active secondary ports and which secondary ports that should be inactive secondary ports without significantly affecting the contribution from the active secondary ports. This is achieved by controlling the phase values of signals fed through active secondary ports and controlling the phase values of signal reflected from inactive secondary ports. Thereby, if an amplifier device of one of the secondary ports fails it is possible to terminate that port without unproportional loss in output power, i.e. graceful degradation.

Figure 1B:
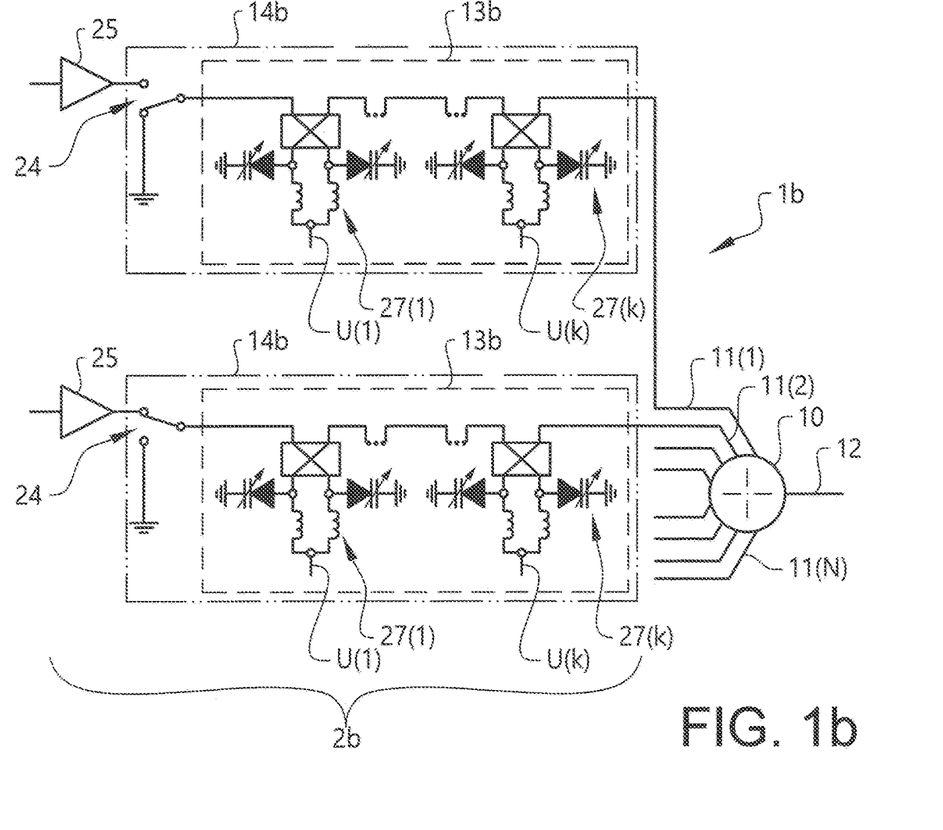

FIG. 1b discloses a second exemplary embodiment of an N-way power combiner network 1b according to the invention. The circuit arrangements 2b of two secondary ports 11(1), 11(2) are disclosed in greater detail than for the other secondary ports 11(N). The phase shifter arrangement 13b of the exemplary embodiment of FIG. 1b comprises a number of varactor diode phase shifting circuits 27(1, . . . , k), operating as phase shifting devices, and a switch 24. In FIG. 1b the first secondary port 11(1) is set in an inactive operation mode and the second secondary port 11(2) is set in an active operation mode. When the secondary port 11(2) is in active operation mode, the voltage over the varactor diode phase shifting circuits 27(1, . . . , k) sets the transmission phase and if the secondary port 11(1) is in inactive operation mode the voltage over the varactor diode phase shifting circuits 27(1, . . . , k) sets the termination load phase. The voltage applied U(1), U(k) over the varactor diodes of the varactor diode phase shifting circuits 27(1, . . . , k) controls the phase shifting. By setting the transmission phase of active secondary ports 11(2) and the termination load phase of inactive secondary ports 11(1) the load impedance seen by active secondary ports 11(2) and the power combiner device 10 can be controlled.

The load control arrangement 14b of the exemplary embodiment of FIG. 1b comprises a phase shifting functionality provided by the varactor diode phase shifting circuits 27(1, . . . , k) and a switch 24. For the power combiner network 1b of FIG. 1b the phase shifter arrangement 13b for the secondary port 11 is arranged between the power combiner device 10 and an amplifier device 25.

Figure 1C:
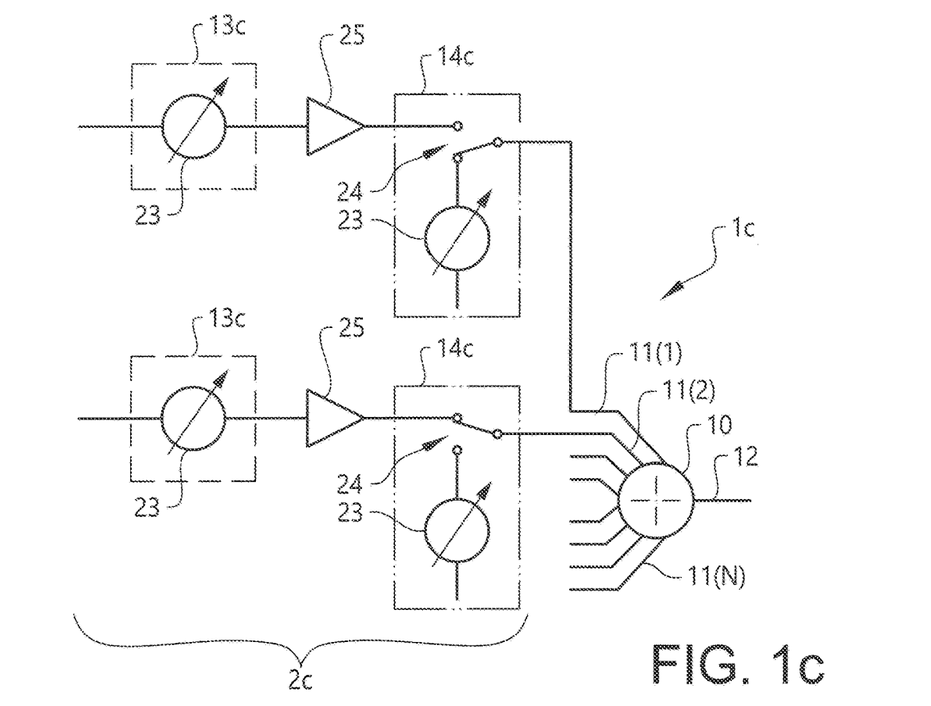

FIG. 1c discloses a third exemplary embodiment of an N-way power combiner network 1c according to the invention. The circuit arrangements 2c of two secondary ports 11(1), 11(2) are disclosed in greater detail than for the other secondary ports 11(N). The circuit arrangements 2c of FIG. 1c comprises a load control arrangement 14c comprising a switch 24 and a phase shifting device 23. When the switch 24 is in the open position the circuit is open and the phase of the reflected signal can be controlled by means of the phase shifting device 23 of the load control arrangement 14c, i.e. the secondary port 11 is an inactive secondary port 11, the circuit is open, i.e. not connected to ground. By means of the phase shifting device 23 the termination load phase can be controlled such that the load impedance seen by the other secondary ports and the power combiner device 10 is essentially the same even if the secondary port 11 is terminated. An amplifier device 25 is provided between the load control arrangement 14c and the phase shifter arrangement 13c. The phase shifter arrangement 13c is also provided with a phase shifting device 23. When the switch 24 is in a closed position the phase shifting device 23 of the phase shifting arrangement 13c controls the phase, and thereby the impedance, seen by the other secondary ports 11(N) and the power combiner device 10.

Figure 1D:
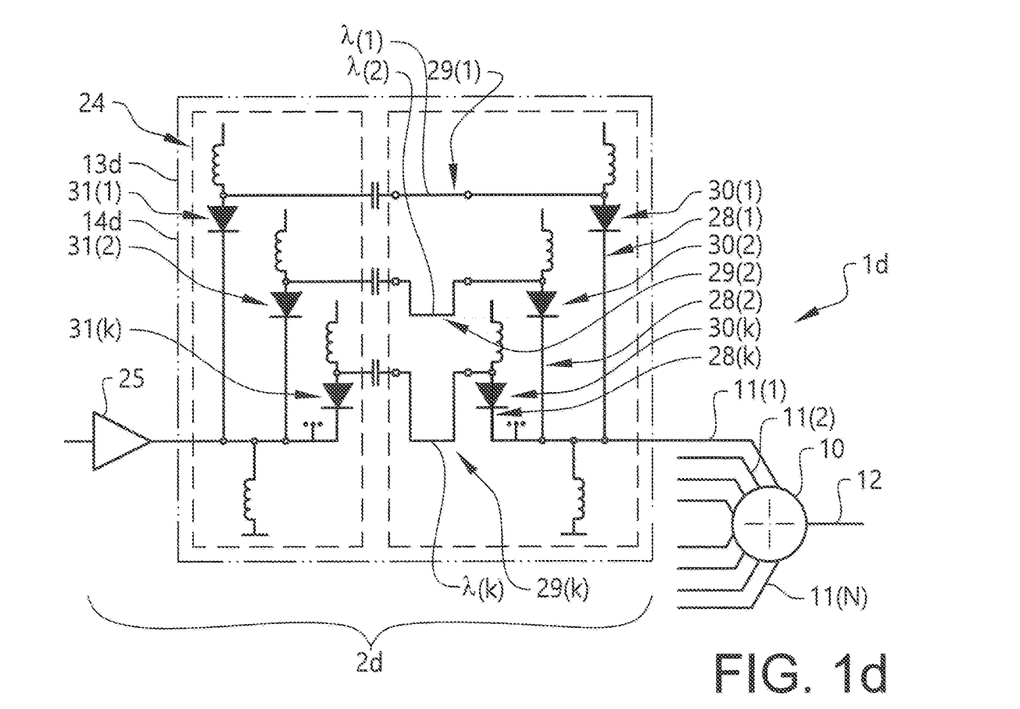

FIG. 1d discloses a fourth exemplary embodiment of yet an N-way power combiner network 1d according to the invention. The circuit arrangement 2d of two secondary ports 11(1), 11(2) are disclosed in greater detail than for the other secondary ports 11(N). The phase shifter arrangement 13d of the exemplary embodiment of FIG. 1d comprises a number of diode phase shifting circuits 28(1, 2, . . . , k) with delay lines 29(1, 2, . . . , k) and a switch 24. Each diode phase shifting circuit 28(1, 2, . . . , k) comprises a first and a second diode 30(1, 2, . . . , k), 31(1, 2, . . . , k) which can be activated by applying a voltage over the diode. The resulting phase of a signal fed through a transmission line is dependent on the electrical length of the transmission line. The delay lines 29(1, 2, . . . , k) of the diode phase shifting circuits 28(1, 2, . . . , k) is of different electrical lengths, indicated by λ(1), λ(2) and λ(k), whereby by controlling through which diode phase shifting circuits 28(1, 2, . . . , k) a signal is fed the phase of that signal can be controlled. In the embodiment of the invention disclosed in FIG. 1d the switch 24 is provided by controlling which of the second diodes 30(1, 2, . . . , k) that are active.

When the switch 24 is in an open position, the secondary port 11(1) is in inactive operation mode. If the switch 24 is in a closed position, the secondary port 11(2) is in an active operation mode. If the secondary port 11(2) is in the active operation mode which of the diode phase shifting circuits 28(1, 2, . . . , k) that is activated, and thereby sets the transmission phase, is determined by for which diode phase shifting circuits 28(1, 2, . . . , k) the first and the second diodes 30(1, 2, . . . , k), 31(1, 2, . . . , k) are active. If the secondary port 11(1) is in the inactive operation mode which of the diode phase shifting circuit circuits 28(1, 2, . . . , k) that is activated, and thereby sets the termination load phase, is determined by for which diode phase shifting circuits 28(1, 2, . . . , k) only the first diode 30(1, 2, . . . , k) is active.

As is disclosed in FIGS. 1a, 1b, 1c and 1d, order of the amplifying device 25, the load control arrangement 14 and the phase shifter arrangement 13 in relation to the power combiner device 10 may vary between different realizations of power combiner networks 1 according to the invention, resulting in that different realization have different advantages and drawbacks. For example, since phase shifting devices generally are lossy components, arranging the amplifier device after the phase shifter arrangement, in relation to the power combiner input direction, has the advantage that the amplified signal is fed to the power combiner device without the losses that feeding the signal through the phase shifter arrangement otherwise would imply.

Figure 2:
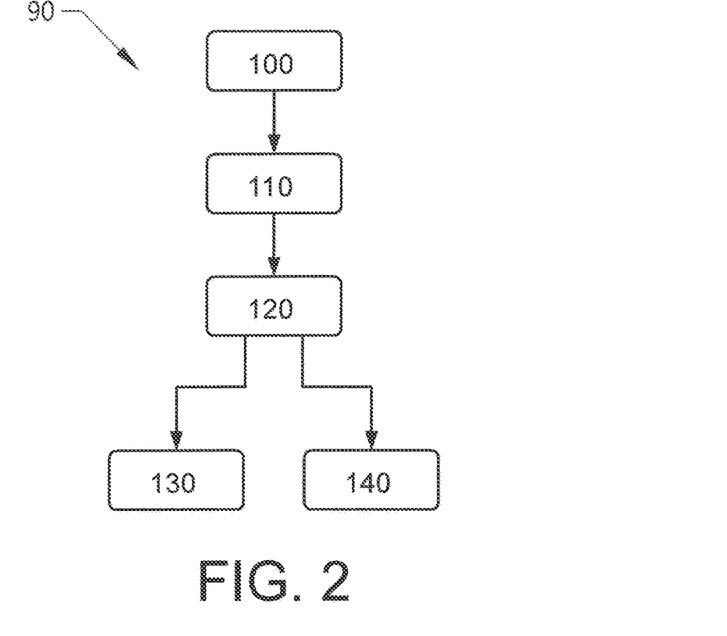

FIG. 2 discloses a flow chart 90 of an exemplary embodiment of a method of operating a power combiner network according to the invention. Exemplary embodiments of power combiner networks has been disclosed in FIGS. 1a, 1b, 1c and 1d. The exemplary method comprises the method steps of;

step A 100, selecting which of the N secondary ports that should be set in an inactive operation mode, thereby being I inactive secondary ports, and which of the N secondary ports that should be set in an active operation mode, thereby being A active secondary ports, step B 110, setting selected I inactive secondary ports in an inactive operation mode by means of the load control arrangement, and step C 120, retrieving a phase required for respective I inactive secondary port and retrieving a phase required for respective A active secondary port in order for respective A active secondary port to minimize the reflected signal from the power combiner device and provide desired power to the primary port, given current conditions.

The retrieved phases required for the I inactive secondary ports and the A active secondary ports respectively, in order for respective A active secondary port to minimize the reflected signal from the power combiner device and provide desired power to the primary port, is subsequently used to perform the method steps of;

step D 130, setting the phase value of respective load control arrangement for respective I inactive secondary port according to respective retrieved phase, and step E 140, setting the phase value of respective phase shifter arrangement for respective A active secondary port according to respective retrieved phase.

An exemplary advantage with the method is that the method enables that which secondary ports that should be set as active secondary ports and which secondary ports that should be set as inactive secondary ports can be selected freely without significantly affecting the contribution from the active secondary ports. In other words, the inactive secondary ports can be terminated in a non-resistive load whereby the input impedance of the N-way power combiner network should not change. Irrespectively of which secondary ports that are combined the method provides that desired output power is obtained from the selected secondary ports.

Figure 3:
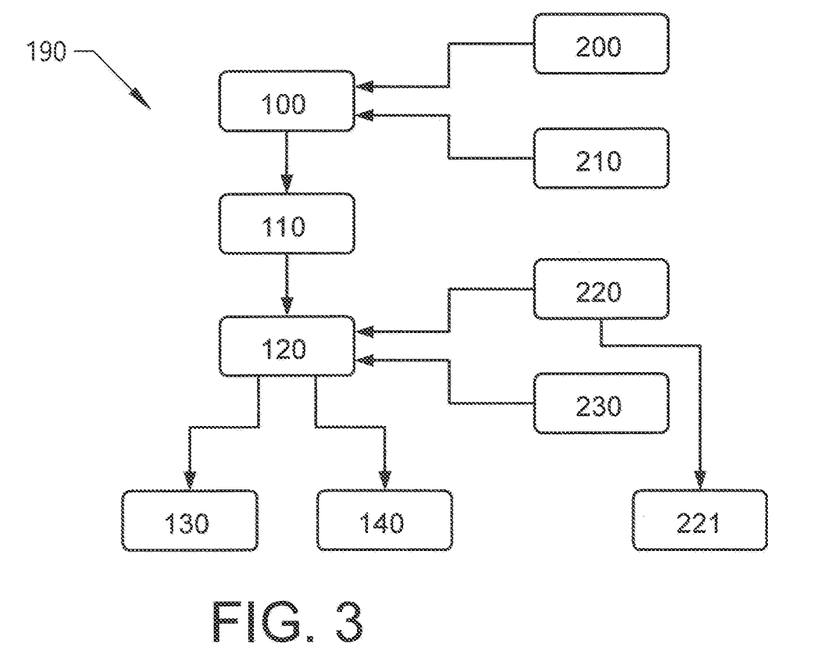

FIG. 3 discloses another flow chart 190 of exemplary embodiments of methods of operating a power combiner networks according to the invention. In addition to the method steps disclosed in FIG. 2, FIG. 3 discloses alternative ways in which the method step of;

step A 100, selecting which of the N secondary ports that should be set in an inactive operation mode, thereby being I inactive secondary ports, and which of the N secondary ports that should be set in an active operation mode, thereby being A active secondary ports, and the method step of;

step C 120, retrieving the phase required for respective I inactive secondary port and retrieving the phase required for respective A active secondary port in order for respective A active secondary port to minimize the reflected signal from the power combiner device and provide desired power to the primary port, may be performed.

The method step of;
  step A 100, selecting which of the N secondary ports that should be set in an inactive operation mode, thereby being I inactive secondary ports, and which of the N secondary ports that should be set in an active operation mode, thereby being A active secondary ports,
may either comprise the sub method step of;
  step AA 200, determining which of the N secondary ports that needs to be combined in order to reach a desired power combiner network output power, or the sub method step of;
  step AB 210, detecting failure of operation of an amplifier device, wherein each of the N secondary port for which a failed amplifier device has been detected is selected to be an I inactive secondary port set in inactive operation mode.

Thus, the method step of selecting which secondary ports that should be set in an inactive operation mode and which secondary ports that should be set in an active operation mode 100 may either be based on desired power combiner network output power, for example maximum possible output power, or be based on detecting and terminating secondary ports with not operational amplifier devices.

In the first exemplary realization the not selected secondary ports, i.e. the secondary ports set in inactive operation mode, are terminated in a non-resistive load by means of the load control arrangement. The transmission phases of the selected secondary ports, i.e. the secondary ports set in active operation mode, are selected such that input impedance seen by the power combiner device is essentially the same.

In the latter exemplary realization graceful degradation is obtained, i.e. the power combiner network output power loss is proportional to the number of failed power combiner network amplifier devices instead of being not proportional due to mismatch. This is achieved by terminating the secondary ports, by means of the load control arrangement, in a non-resistive load and selecting the transmission phases of the still operational secondary ports, i.e. the secondary ports set in active operation mode, such that input impedance seen by the power combiner device is essentially the same. Thereby the load impedance seen by the active amplifier devices also remains essentially the same even though some of the amplifier devices have failed. If an amplifier device fails may for example be detected by measuring the amount of power consumed by the amplifier device or by means of having a power detector coupled to the amplifier device.

The method step of;
  step C 120, retrieving the termination load phase required for respective I inactive secondary port and retrieving the transmission phase required for respective A active secondary port in order for respective A active secondary port to minimize the reflected signal from the power combiner device and provide desired power to the primary port,
may either comprise the sub method steps of;
  step CA 220, accessing a reference database, and
  step CB 221, retrieving respective required transmission and termination load phase from the reference database,
or the sub method step of;
  step CC 230, calculating respective required transmission and termination load phase.

Accessing and retrieving data regarding required transmission phases, for active secondary ports, and termination load phases, for inactive secondary ports, may, when possible, be an efficient way to obtain required phase values. It is also possible to calculate required transmission phase and load termination phase from real time calculations. Such real time calculations may advantageously use for this purpose specifically developed algorithms.

The foregoing has described the principles, preferred embodiments and modes of operation of the invention. However, the invention should be regarded as illustrative rather than restrictive, and not as being limited to the particular examples discussed above. The different features of the various exemplary embodiments of the invention can be combined in other combinations than those explicitly described, unless when incompatibility is explicitly indicated. It should therefore be understood that variations may be made in those exemplary embodiments without departing from the scope of the invention as defined by the following claims.

The invention claimed is:

1. Method of operating a power combiner network (1), the power combiner network (1) comprising a power combiner device (10) having N secondary ports (11(1, 2, ..., N)) combining into one primary port (12), wherein respective N secondary port (11(1, 2, N)) is provided with a phase shifter arrangement (13), wherein respective phase shifter arrangement (13) is configured to set a phase of a signal fed through respective N secondary port (11(1, 2, ..., N)), and a load control arrangement (14), wherein respective load control arrangement (14) is configured to set the N secondary ports (11(1, 2, ..., N)) in an active or in an inactive operation mode, and for I inactive secondary ports (11(1, 2, ..., N)) which are set in inactive operation mode the load control arrangement (14) is further configured to set a phase of the signal reflected from the I inactive secondary ports (11(1, 2, ..., N)), wherein the method comprises the method steps of;
  step A (100), selecting which of the N secondary ports (11(1, 2, ..., N)) that should be set in an inactive operation mode, thereby being I inactive secondary ports (11(1)), and which of the N secondary ports (11(1, 2, ..., N)) that should be set in an active operation mode, thereby being A active secondary ports (11(2)),
  step B (110), setting selected I inactive secondary ports (11(1, 2, ..., N)) in an inactive operation mode by means of the load control arrangement (14),
  step C (120), retrieving a phase required for respective I inactive secondary port (11(1)) and retrieving a phase required for respective A active secondary port (11(2)) in order for respective A active secondary port (11(2)) to minimize the reflected signal from the power combiner device (10) and provide desired power to the primary port (12),
  step D (130), setting the phase value of respective load control arrangement (14) for respective I inactive secondary port (11(1)) according to respective retrieved phase, and
  step E (140), setting the phase value of respective phase shifter arrangement (13) for respective A active secondary port (11(2)) according to respective retrieved phase.

2. Method of operating a power combiner network (1) according to claim 1, wherein the step of;
  step A (100), selecting which of the N secondary ports (11(1, 2, ..., N)) that should be set in an inactive operation mode, thereby being I inactive secondary ports (11(1)), and which of the N secondary ports (11(1, 2, ..., N)) that should be set in an active operation mode, thereby being A active secondary ports (11(2)), comprises the sub method step of;

step AA (200), determining which of the N secondary ports (11(1, 2, ..., N)) that needs to be combined in order to reach a desired power combiner network (11(1, 2, ..., N)) output power.

3. Method of operating a power combiner network (1) according to claim 1, wherein each N secondary port (11(1, 2, ..., N)) of the power combiner device (10) comprises an amplifier device (25), and wherein the method step of;
step A (100), selecting which of the N secondary ports (11(1, 2, ..., N)) that should be set in an inactive operation mode, thereby being I inactive secondary ports (11(1)), and which of the N secondary ports (11(1, 2, ..., N)) that should be set in an active operation mode, thereby being A active secondary ports (11(2)), comprises the sub method step of;
step AB (210), detecting failure of operation of the amplifier device (25), wherein each of the N secondary port (11(1, 2, ..., N)) for which a failed amplifier device (25) has been detected is selected to be an I inactive secondary port (11(1)) set in inactive operation mode.

4. Method of operating a power combiner network (1) according to claim 1, wherein the method steps of;
step C (120), retrieving the phase required for respective I inactive secondary port (11(1)) and retrieving the phase required for respective A active secondary port (11(2)) in order for respective A active secondary port (11(2)) to minimize the reflected signal from the power combiner device (10) and provide desired power to the primary port (12), comprises the sub method steps of;
step CA (220), accessing a reference database, and
step CB (221), retrieving respective required phase from the reference database.

5. Method of operating a power combiner network (1) according to claim 1, wherein the method steps of;
step C (120), retrieving the phase required for respective I inactive secondary port (11(1)) and retrieving the phase required for respective A active secondary port (11(2)) in order for respective A active secondary port (11(2)) to minimize the reflected signal from the power combiner device (10) and provide desired power to the primary port (12), comprises the sub method step of;
step CC (230), calculating respective required phase.

6. Power combiner network (1) comprising a power combiner device (10) having N secondary ports (11(1, 2, ..., N)) combining into one primary port (12), wherein respective N secondary port (11(1, 2, ..., N)) is provided with a phase shifter arrangement (13), wherein respective phase shifter arrangement (13) is configured to set a phase of a signal fed through respective N secondary port (11(1, 2, ..., N)), and a load control arrangement (14), wherein respective load control arrangement (14) is configured to set N secondary ports (11(1, 2, ..., N)) in an active or in an inactive operation mode, and for I inactive secondary ports (11(1)) set in inactive operation mode the load control arrangement (14) is further configured to set a phase of the signal reflected from the I inactive secondary ports (11(1)) and seen by the power combiner device (10), whereby the power combiner network (1) is configured to execute a method according to claim 1.

7. Power combiner network (1) according to claim 6, wherein respective secondary port is provided with an amplifier device (25).

8. Power combiner network (1c) according to claim 7, wherein respective amplifier device (25) is arranged between the power combiner device (10) and the phase shifter arrangement (13c) for respective N secondary port (11(1, 2, ..., N)).

9. Power combiner network (1a, 1b, 1d) according to claim 7, wherein respective phase shifter arrangement (13a, 13b, 13d) is arranged between the power combiner device (10) and the amplifier device (25) for respective N secondary port (11(1, 2, ..., N)).

10. Power combiner network (1) according to claim 6, wherein the load control arrangement (14) comprises a switch (24) and a phase shifting device (23).

11. Power combiner network (1a, 1b, 1d) according to claim 10, wherein the phase shifter arrangement (13a, 13b, 13d) and the phase shifting device (23) of the load control arrangement (14a, 14b, 14d) is the same component.

12. A computer program comprising computer program code for performing the method steps of claim 1, when said computer program is executed by a computer device.

13. A computer readable medium carrying a computer program comprising computer program code for performing the steps of claim 1, when said computer program is executed on a computer device.

14. A control unit for controlling the operation of a power combiner network (1), the control unit being configured to perform the steps of the method according to claim 1.

* * * * *

UNITED STATES PATENT AND TRADEMARK OFFICE
CERTIFICATE OF CORRECTION

| | | |
|---|---|---|
| PATENT NO. | : 11,962,059 B2 | Page 1 of 1 |
| APPLICATION NO. | : 17/250560 | |
| DATED | : April 16, 2024 | |
| INVENTOR(S) | : Magnus Isacsson | |

It is certified that error appears in the above-identified patent and that said Letters Patent is hereby corrected as shown below:

On the Title Page

In Column 2, item (57), Abstract, Line 3, delete "(11(1, 2, N))" and insert -- (11(1, 2, . . . , N)) --, therefor.

In the Claims

In Column 14, Line 22, Claim 1, delete "(11(1, 2, N))" and insert -- (11(1, 2, . . . , N)) --, therefor.

Signed and Sealed this
Thirteenth Day of August, 2024

Katherine Kelly Vidal
*Director of the United States Patent and Trademark Office*